(12) United States Patent
Hirata

(10) Patent No.: US 7,793,698 B2
(45) Date of Patent: Sep. 14, 2010

(54) BONDING DEVICE

(75) Inventor: Atsuhiko Hirata, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 197 days.

(21) Appl. No.: 12/102,200

(22) Filed: Apr. 14, 2008

(65) Prior Publication Data
US 2008/0210383 A1 Sep. 4, 2008

Related U.S. Application Data

(63) Continuation of application No. PCT/JP2006/317455, filed on Sep. 4, 2006.

(30) Foreign Application Priority Data

Oct. 12, 2005 (JP) .............................. 2005-297723

(51) Int. Cl.
*B32B 37/00* (2006.01)
(52) U.S. Cl. ...................... 156/498; 156/581; 156/583.1
(58) Field of Classification Search ................. 156/228, 156/498, 580, 581, 583.1
See application file for complete search history.

(56) References Cited

U.S. PATENT DOCUMENTS

2008/0245472 A1 * 10/2008 Hirata et al. ................. 156/264

FOREIGN PATENT DOCUMENTS

| JP | 09-283392 | * | 10/1997 |
|---|---|---|---|
| JP | 9-283392 | | 10/1997 |
| JP | 10-242174 | | 9/1998 |
| JP | 10-242174 A | * | 9/1998 |
| JP | 2000-332061 | | 11/2000 |
| JP | 2004-63947 | | 2/2004 |
| JP | 2004-063947 | * | 2/2004 |
| JP | 2004-127981 | * | 4/2004 |
| JP | 2005-109219 | | 4/2005 |
| JP | 2005-109219 A | * | 4/2005 |

OTHER PUBLICATIONS

International Search Report.
Written Opinion with English language translation.

* cited by examiner

*Primary Examiner*—James Sells
(74) *Attorney, Agent, or Firm*—Keating & Bennett, LLP

(57) ABSTRACT

A bonding device that is not affected by heat and that maintains wafers to be bonded parallel to each other so as to increase the accuracy with which the wafers are bonded. Spaces are formed between a first block member and a first pressure shaft and between a second block member and a second pressure shaft. In this way, little heat is transferred from the first block member and the second block member to the first pressure shaft and the second pressure shaft and a substantially uniform temperature is maintained inside the first block member and the second block member. Stresses caused by a difference between thermal expansion of the first block member and the second block member and thermal expansion of the first pressure shaft and the second pressure shaft are relieved by deflection of the first support pillar members and the second support pillar members.

15 Claims, 5 Drawing Sheets

BONDING DEVICE

CROSS-REFERENCE TO RELATED APPLICATIONS

This is a continuation under 35 U.S.C. §111(a) of PCT/JP2006/317455 filed Sep. 4, 2006, and claims priority of JP2005-297723 filed Oct. 12, 2005, incorporated by reference.

BACKGROUND

1. Technical Field

The present disclosure relates to a bonding device for bonding electronic components, such as wafers, to each other using a thermal compression bonding technique.

2. Background Art

Some existing chip thermocompression-bonding tools include a metal block mounted on the lower end of a tool body thereof. A ceramic holder is mounted on the lower end of the metal block. The ceramic holder is sintered together with a ceramic heater and a ceramic indenter. The linear expansion coefficient of the ceramic holder is substantially the same as that of the ceramic heater and the ceramic indenter. In addition, the thermal conductivities of the ceramic holder and the ceramic indenter increase from the ceramic heater towards a pressure-applying surface of the ceramic indenter, and decrease towards a mounting surface of the ceramic holder (refer to Patent Document 1 listed below).

In such chip thermocompression-bonding tools, little heat is transferred to a tool body and a mounting portion of the ceramic holder and little space is required for the ceramic holder, the ceramic heater, and the ceramic indenter. Accordingly, extension of the tool body having a parallelization adjustment function due to thermal expansion and deviation of the degree of parallelization (distortion) can be eliminated. In addition, a temperature difference between neighboring layers of the ceramic holder can be reduced (i.e., the amount of heat is not rapidly reduced, but is gradually reduced) by sintering the ceramic holder so that the thermal conductivity is gradually reduced from the ceramic heater to the ceramic holder mounted portion and employing a lamination structure having the same or substantially the same thermal expansion coefficient. Thus, heat deformation of the ceramic indenter, the ceramic heater, and the tool body can be reduced. In this way, this lamination structure allows heat to be easily transferred to the chip pressure side while allowing little heat to be transferred to the side of the tool body having a parallelization adjustment function. In addition, this lamination structure has the same or substantially the same thermal expansion coefficient. Consequently, the problems caused by heat can be solved, and therefore, the chip thermocompression-bonding tool can be assembled with a high degree of accuracy (refer to Patent Document 1 listed below).

[Patent Document 1] Japanese Unexamined Patent Application Publication No. 2000-332061

To achieve such a structure, a sintered body having lamination structure with varying thermal conductivity needs to be manufactured. Accordingly, the manufacturing process is complicated. In addition, when the thermal expansion coefficient is the same, deformation occurs in portions where a temperature gradient is present. Therefore, even if the temperature difference between the neighboring layers can be reduced, a relatively large amount of heat deformation occurs. Consequently, the flatness of an attractive surface of a chip for a small workpiece can be maintained. However, if the above-described existing technology is applied to a wafer having a large area, it is difficult to maintain the flatness of an attractive surface for a wafer. In addition, the ceramic heater is not thermally isolated from the tool body by a space. Accordingly, even when the thermal conductivity of a material is reduced, and heat transfer to the tool body is reduced, the effect is limited. As a result, the heat capacity of a portion to be heated is unnecessarily increased. Thus, when the existing technology is applied to a wafer having a large area, a time required for heating and cooling is disadvantageously increased.

SUMMARY

Accordingly, the present disclosure describes a bonding device that is not affected by heat and that is capable of maintaining electronic components to be bonded parallel to each other, increasing and stabilizing the accuracy with which the electronic components are bonded.

A first feature provides a bonding device including a first block member, a first pressure member disposed on the first block member with a first space therebetween, a plurality of rod-shaped first flexible members disposed in the first space, a second block member disposed so as to be capable of facing the first block member, a second pressure member disposed on the second block member with a second space therebetween, a plurality of rod-shaped second flexible members disposed in the second space, and a heating member. The first block member grasps a first electronic component using one end surface thereof. The first pressure member applies a pressure to the first block member in a predetermined direction. The first flexible members are connected to the other end surface of the first block member so as to be circumferentially equiangularly spaced about the center line of the first block member. The first flexible members transfer the pressure applied by the first pressure member to the first block member. The second block member grasps a second electronic component to be bonded to the first electronic component using one end surface thereof. The second pressure member applies a pressure to the second block member in a direction in which the second block member urges the first block member. The second flexible members are connected to the other end surface of the second block member so as to be circumferentially equiangularly spaced about the center line of the second block member. The second flexible members transfer the pressure applied by the second pressure member to the second block member. The heating member heats the first block member and the second block member.

According a second feature, a through-opening is formed in at least one of the first block member and the second block member so as to pass through at least one of the first block member and the second block member in a thickness direction.

According to a third feature, an opening area of the through-opening formed in one of the first block member and the second block member on one side in the thickness direction is larger than an opening area on the other side in the thickness direction.

According to a fourth feature, the heating member is a heater chip, and wherein the first block member comprises a first pressure plate unit for grasping the first electronic component, a first back plate unit connected to the first pressure plate unit and having a linear expansion coefficient that is the same as or substantially the same as a linear expansion coefficient of the first pressure plate unit, and the heater chip connected to the first back plate unit, the heater chip heats the first pressure plate unit and has a linear expansion coefficient that is the same as or substantially the same as the linear expansion coefficient of the first pressure plate unit, and wherein the second block member comprises a second pressure plate unit for grasping the second electronic component, a second back plate unit connected to the second pressure plate unit and having a linear expansion coefficient that is the same as or substantially the same as a linear expansion coefficient of the second pressure plate unit, and the heater chip connected to the second back plate unit, the heater chip heats the second pressure plate unit and has a linear expansion coefficient that is the same as or substantially the same as the linear expansion coefficient of the second pressure plate unit.

According to a fifth feature, the first pressure plate unit and the second pressure plate unit are formed from an electrically conductive material, and the first back plate unit and the second back plate unit are formed from an electrically insulating material.

According to a sixth feature, a first cooling gas flow passage that allows cooling gas to flow therethrough is formed between the first pressure plate unit and the first back plate unit, and a second cooling gas flow passage that allows cooling gas to flow therethrough is formed between the second pressure plate unit and the second back plate unit.

According to a seventh feature, the first flexible members further have a cooling gas supply function that allows the cooling gas to flow therethrough and allows the cooling gas to be supplied to the first cooling gas flow passage, and the second flexible members further have a cooling gas supply function that allows the cooling gas to flow therethrough and allows the cooling gas to be supplied to the second cooling gas flow passage.

According to an eighth feature, the bonding device further includes first attracting means for attracting the first electronic component to the first pressure plate unit and second attracting means for attracting the second electronic component to the second pressure plate unit.

According to a ninth feature, in the first attracting means includes a plurality of first attraction grooves formed in the first pressure plate unit and a first hollow duct that allows air drawn from the first attraction grooves to flow therethrough, and the second attracting means includes a plurality of second attraction grooves formed in the second pressure plate unit and a second hollow duct that allows air drawn from the second attraction grooves to flow therethrough.

According to a tenth feature, the first hollow duct is connected to the first pressure member via a first elastic member, and the second hollow duct is connected to the second pressure member via a second elastic member.

According to an eleventh feature, a first cooling gas supply flow passage that allows the cooling gas supplied to the first flexible members to flow therethrough and a first air flow passage that allows air drawn from the first hollow duct to flow therethrough are formed in the first pressure member, and a second cooling gas supply flow passage that allows the cooling gas supplied to the second flexible members to flow therethrough and a second air flow passage that allows air drawn from the second hollow duct to flow therethrough are formed in the second pressure member.

According to a twelfth feature, in the first cooling fluid circulation passage for circulating cooling fluid that cools the first pressure member is formed in the first pressure member, and a second cooling fluid circulation passage for circulating cooling fluid that cools the second pressure member is formed in the second pressure member.

According to one or more of the foregoing features, the first electronic component is grasped by one end surface of the first block member, and the second electronic component is grasped by one end surface of the second block member. The first block member and the second block member are then heated by the heating member. When first block member and the second block member are heated, the heat is transferred to the first electronic component and the second electronic component. Subsequently, the first block member is pressed by the first pressure member in a predetermined direction. At that time, a pressure applied by the first pressure member is transferred to the first block member via the plurality of rod-shaped first flexible members disposed in a first space formed between the first block member and the first pressure member. Similarly, the second block member is pressed by the second pressure member in a predetermined direction. At that time, a pressure applied by the second pressure member is transferred to the second block member via the plurality of rod-shaped second flexible members disposed in a second space formed between the second block member and the second pressure member. The first block member and the second block member are pressed against each other by application of the pressures. In this way, the first electronic component and the second electronic component are pressed against each other so as to be bonded to each other while being heated.

Heating the first electronic component and the second electronic component causes thermal expansion of the first electronic component and the second electronic component. Since the first space is formed between the first block member and the first pressure member, and the second space is formed between the second block member and the second pressure member, transfer of almost all the heat from the first block member and the second block member to the first pressure member and the second pressure member is blocked by the first space and the second space, respectively. In this way, a uniform temperature can be maintained inside each of the first block member and the second block member. In addition, when the first electronic component is in contact with the second electronic component, the overall temperature of the first block member, the second block member, the first electronic component, and the second electronic component can be maintained substantially uniform. As a result, the flatness of the surface of the first block member for grasping the first electronic component and the flatness of the surface of the second block member for grasping the second electronic component can be maintained.

Even when the first block member and the second block member are heated, the presence of the first space and the second space reduces heat transferred from the first block member and the second block member to the first pressure member and the second pressure member, respectively. Thus, practically, only the first block member, the second block member, the first electronic component, and the second electronic component are heated by the heating member. Accordingly, the heat capacity of a portion to be heated is reduced, and therefore, a time required for heating and cooling the first electronic component and the second electronic component can be reduced. As a result, the operation availability of the bonding device can be increased.

In addition, deflection of each of the first flexible members and the second flexible members can relieve the stress caused by a difference between thermal expansion of the first block member and the second block member and thermal expansion of the first pressure member and the second pressure member. That is, since the first flexible members and the second flexible members have a rod shape, the bending rigidity thereof is relatively small. Accordingly, the first flexible members and the second flexible members can bend without causing curvature deformation of the first block member and the second block member. Thus, the difference between the thermal expansions can be relieved. As a result, the flatness of the surface of the first block member for grasping the first electronic component and the flatness of the surface of the second block member for grasping the second electronic component can be maintained.

At that time, the first flexible members are disposed so as to be circumferentially equiangularly spaced about the center line of the first block member. Accordingly, a shift of the center of the first block member from the center of the first pressure member due to deflection of the first flexible members can be prevented. Similarly, the second flexible members are disposed so as to be circumferentially equiangularly spaced about the center line of the second block member. Accordingly, a shift of the center of the second block member from the center of the second pressure member due to deflection of the second flexible members can be prevented. Consequently, the first electronic component is not shifted from the second electronic component due to application of heat. In addition, the occurrence of stress in the first electronic component and the second electronic component can be prevented.

In addition, since the first flexible members are disposed so as to be circumferentially equiangularly spaced about the center line of the first block member, the pressure is transferred from the first pressure member to the first block member in a well balanced manner. Similarly, since the second flexible members are disposed so as to be circumferentially equiangularly spaced about the center line of the second block member, the pressure is transferred from the second pressure member to the second block member in a well balanced manner. Consequently, the pressures applied to the first electronic component and the second electronic component are uniform throughout the surfaces.

According to the second feature, a through-opening is formed in at least one of the first block member and the second block member so as to pass through at least one of the first block member and the second block member in a thickness direction. Therefore, by disposing an image capturing member for capturing the image of one of the first electronic component and the second electronic component in one of the first space and the second space, the image of one of the first electronic component and the second electronic component can be captured through the through-opening. By appropriately moving one of the first block member and the second block member on the basis of the result of the image capturing operation performed by the image capturing member, relative positioning of the first electronic component or the second electronic component can be easily achieved. As a result, the accuracy with which the first electronic component is bonded to the second electronic component can be increased.

According to the third feature, an opening area of the through-opening formed in one of the first block member and the second block member on one side in the thickness direction is larger than an opening area on the other side in the thickness direction. Therefore, when an image capturing member for capturing the image of one of the first electronic component and the second electronic component is disposed in one of the first space and the second space, the first block member or the second block member does not interfere with a light path from one of the first electronic component and the second electronic component to the image capturing member. As a result, the accuracy with which the image is captured can be increased. It follows that the accuracy with which the first electronic component is bonded to the second electronic component can be increased.

According to the fourth feature, the first block member includes a first pressure plate unit for grasping the first electronic component, a first back plate unit connected to the first pressure plate unit and having a linear expansion coefficient that is the same as or substantially the same as a linear expansion coefficient of the first pressure plate unit, and the heater chip connected to the first back plate unit. The heater chip heats the first pressure plate unit and has a linear expansion coefficient that is the same as or substantially the same as the linear expansion coefficient of the first pressure plate unit. Therefore, the differences among the amounts of thermal expansion of the first pressure plate unit, the first back plate unit, and the heater chip can be reduced. Thus, curvature deformation of the first block member can be prevented, and therefore, the flatness of the first block member can be maintained.

Similarly, the second block member includes a second pressure plate unit for grasping the second electronic component, a second back plate unit connected to the second pressure plate unit and having a linear expansion coefficient that is the same as or substantially the same as a linear expansion coefficient of the second pressure plate unit, and the heater chip connected to the second back plate unit. The heater chip heats the second pressure plate unit and has a linear expansion coefficient that is the same as or substantially the same as the linear expansion coefficient of the second pressure plate unit. Therefore, the differences among the amounts of thermal expansion of the second pressure plate unit, the second back plate unit, and the heater chip can be reduced. Thus, curvature deformation of the second block member can be prevented, and therefore, the flatness of the second block member can be maintained.

According to the fifth feature, the first pressure plate unit and the second pressure plate unit are formed from an electrically conductive material, and the first back plate unit and the second back plate unit are formed from an electrically insulating material. Therefore, the first pressure plate unit is electrically insulated from the heater chip. In addition, the second pressure plate unit is electrically insulated from the heater chip. Thus, by applying a predetermined voltage to the first pressure plate unit and the second pressure plate unit with heat being applied to the first pressure plate unit and the second pressure plate unit, the first electronic component is bonded to the second electronic component using anodic bonding. As a result, the variety of bonding methods for bonding the first electronic component to the second electronic component can be increased.

According to the sixth feature, a first cooling gas flow passage that allows cooling gas to flow therethrough is formed between the first pressure plate unit and the first back plate unit. Therefore, by forcing cooling gas to flow through the first cooling gas flow passage, the first block member can be rapidly cooled. In addition, a second cooling gas flow passage that allows cooling gas to flow therethrough is formed between the second pressure plate unit and the second back plate unit. Therefore, by forcing cooling gas to flow through the second cooling gas flow passage, the second block member can be rapidly cooled. In this way, the first electronic component and the second electronic component can be rapidly cooled, and therefore, the operation availability of the bonding device can be increased.

According to the seventh feature, the first flexible members further have a cooling gas supply function that allows the cooling gas to flow therethrough and allows the cooling gas to be supplied to the first cooling gas flow passage. Therefore, the first flexible members can be used for means for supplying cooling gas to the first cooling gas flow passage.

Similarly, the second flexible members further have a cooling gas supply function that allows the cooling gas to flow therethrough and allows the cooling gas to be supplied to the second cooling gas flow passage. Therefore, the second flexible members can be used for means for supplying cooling gas to the second cooling gas flow passage.

According to the eighth feature, the bonding device includes first attracting means for attracting the first electronic component to the first pressure plate unit and second attracting means for attracting the second electronic component to the second pressure plate unit. Therefore, the first pressure plate unit can easily and reliably grasp the first electronic component. The second pressure plate unit can easily and reliably grasp the second electronic component. In this way, positional shift of the first electronic component from the first pressure plate unit can be prevented. In addition, positional shift of the second electronic component from the second pressure plate unit can be prevented. As a result, the accuracy with which the first electronic component is bonded to the second electronic component can be increased.

According to the ninth feature, the first attracting means includes a plurality of first attraction grooves formed in the first pressure plate unit and a first hollow duct that allows air drawn from the first attraction grooves to flow therethrough. Therefore, air drawn from the first attraction grooves is allowed to flow through the first hollow duct. Thus, the first electronic component can be reliably attracted using a vacuuming attractive force.

Similarly, the second attracting means includes a plurality of second attraction grooves formed in the second pressure plate unit and a second hollow duct that allows air drawn from the second attraction grooves to flow therethrough. Therefore, air drawn from the second attraction grooves is allowed to flow through the second hollow duct. Thus, the second electronic component can be reliably attracted using a vacuuming attractive force.

According to the tenth feature, the first hollow duct is connected to the first pressure member via a first elastic member. Therefore, when the amount of heat deformation of the first flexible member is relatively different from that of the first hollow duct, stress transferred from the first pressure member to the first block member via the first hollow duct can be relieved by elastic deformation of the first elastic member. In this way, transfer of the stress from the first pressure member to the first block member via the first hollow duct can be prevented. As a result, the flatness of the first block member can be maintained.

Similarly, the second hollow duct is connected to the second pressure member via a second elastic member. Therefore, when the amount of heat deformation of the second flexible member is relatively different from that of the second hollow duct, stress transferred from the second pressure member to the second block member via the second hollow duct can be relieved by elastic deformation of the second elastic member. In this way, transfer of the stress from the second pressure member to the second block member via the second hollow duct can be prevented. As a result, the flatness of the second block member can be maintained.

According to the eleventh feature, a first cooling gas supply flow passage that allows the cooling gas supplied to the first flexible members to flow therethrough and a first air flow passage that allows air drawn from the first hollow duct to flow therethrough are formed in the first pressure member. Therefore, the first pressure member can be used as part of cooling gas supply means and part of air discharging means. Similarly, a second cooling gas supply flow passage that allows the cooling gas supplied to the second flexible members to flow therethrough and a second air flow passage that allows air drawn from the second hollow duct to flow therethrough are formed in the second pressure member. Therefore, the second pressure member can be used as part of the cooling gas supply means and part of the air discharging means. In this way, the need for directly connecting pipes to the first block member and the second block member that have high temperature is eliminated. Thus, cooling and vacuum attraction can be easily achieved.

According to the twelfth feature, since a first cooling fluid circulation passage for circulating cooling fluid that cools the first pressure member is formed in the first pressure member, the first pressure member can be cooled at all times by circulating cooling fluid in the first cooling fluid circulation passage. In this way, the first pressure member can be maintained at a further low temperature even when the bonding device is operating. Accordingly, when a tube for supplying cooling gas or cooling fluid to the first pressure member or a tube for discharging air from the first pressure member is connected, the tube can be easily connected regardless of the material of the tube.

Similarly, since a second cooling fluid circulation passage for circulating cooling fluid that cools the second pressure member is formed in the second pressure member, the second pressure member can be cooled at all times by circulating cooling fluid in the second cooling fluid circulation passage. In this way, the second pressure member can be maintained at a further low temperature even when the bonding device is operating. Accordingly, when a tube for supplying cooling gas or cooling fluid to the second pressure member or a tube for discharging air from the second pressure member is connected, the tube can be easily connected regardless of the material of the tube.

Other features and advantages of the bonding device will become apparent from the following description of embodiments thereof which refers to the accompanying drawings.

DETAILED DESCRIPTION

Reference Numerals

Figure 1:
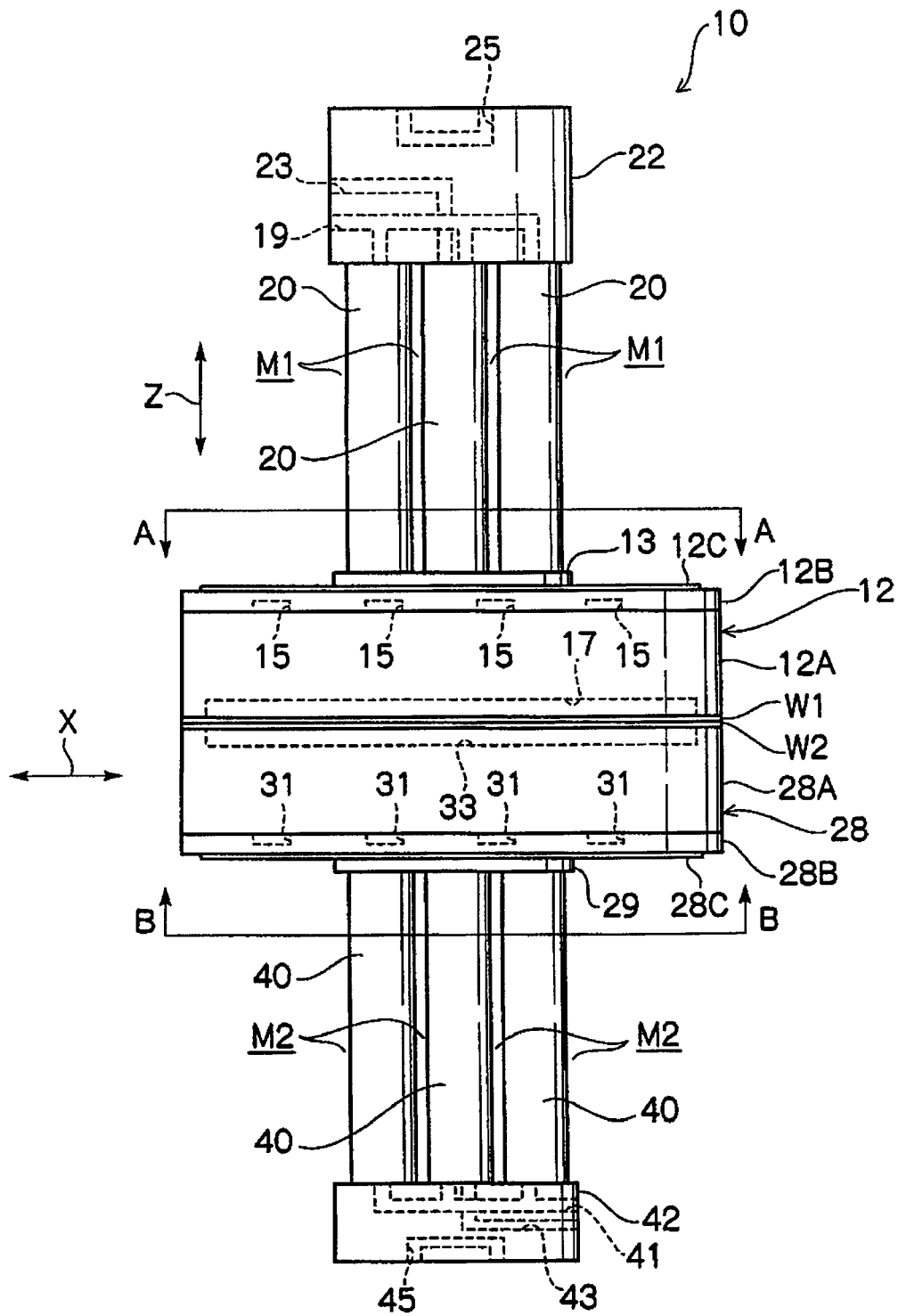
FIG. 1 is a partial schematic configuration diagram of a bonding device according to an embodiment.

10 bonding device
12 first block member
12A first pressure plate unit
12B first back plate unit
12C first heater chip (heating member, heater chip)
15 first cooling groove (first cooling gas flow passage)
17 first attraction groove 19 first N₂ gas supply flow passage (first cooling gas supply flow passage)
20 first support pillar member (first flexible member)
22 first pressure shaft (first pressure member)
23 first air flow passage
24 first hollow member (first hollow duct)
25 first cooling fluid circulation passage
26 first O ring (first elastic member)
28 second block member
28A second pressure plate unit
28B second back plate unit
28C second heater chip (heating member, heater chip)
31 second cooling groove (second cooling gas flow passage)
33 second attraction groove
36 notch (through-opening)
40 second support pillar member (second flexible member)
41 second N₂ gas supply flow passage (second cooling gas supply flow passage)
42 second pressure shaft (second pressure member)
43 second air flow passage
44 second hollow member (second hollow duct)
45 second cooling fluid circulation passage
M1 first space
M2 second space
W1 first wafer (first electronic component)
W2 second wafer (second electronic component)

A bonding device according to an embodiment is described with reference to the accompanying drawings. While the present embodiment will be described with reference to a bonding device for bonding wafers (examples of electronic components) to each other, the present invention is not limited to bonding of wafers. The present invention can be applied to bonding of other electronic components.

Figure 2:
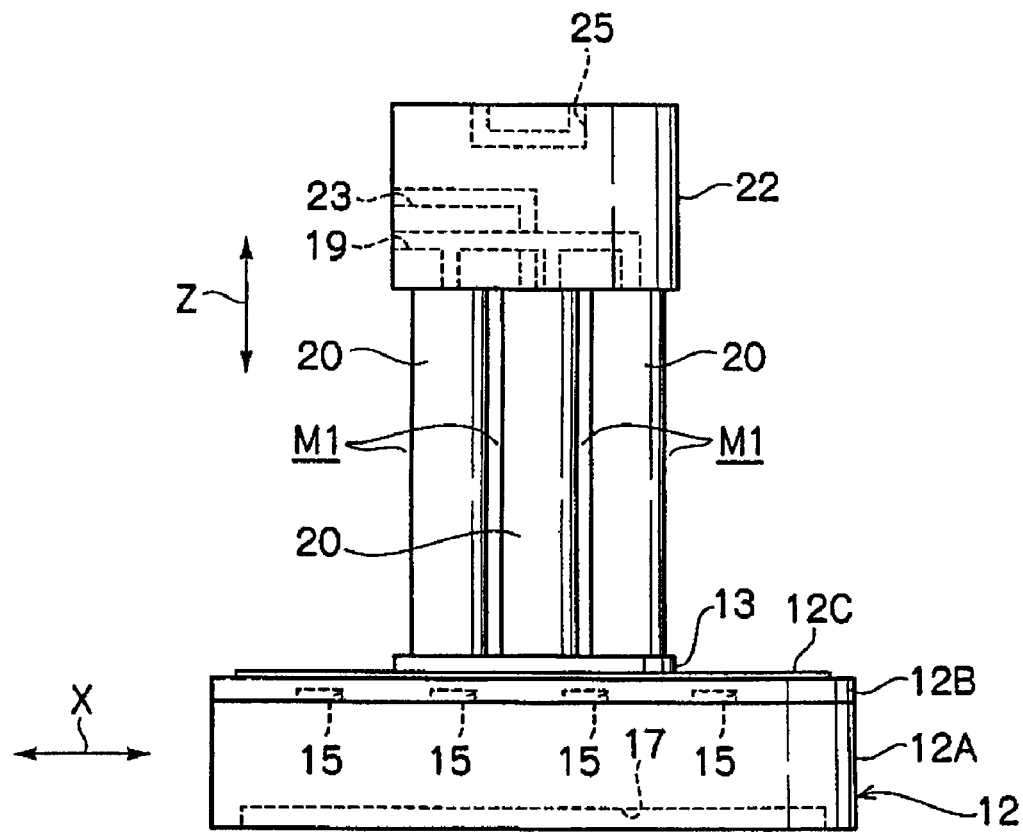
FIG. 2 is a schematic configuration diagram illustrating a first block member, a first flexible member, and a first pressure member of a bonding device according to the embodiment.
Figure 3:
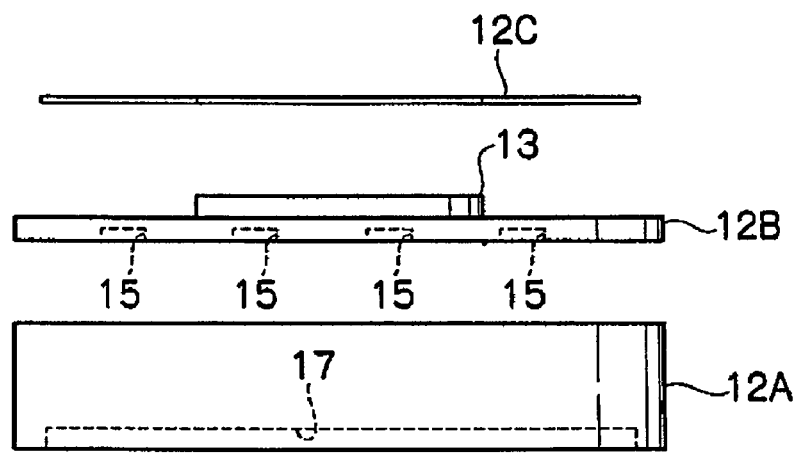
FIG. 3 is an exploded view of a first block member of a bonding device according to the embodiment.

As shown in FIGS. 1 to 3, a bonding device 10 includes a first pressure plate unit 12A having a cylindrical shape that forms a first block member 12. The first pressure plate unit 12A is formed from silicon carbide (SiC), which is an electrically conductive material. The first pressure plate unit 12A includes a plurality of first attraction grooves 17 formed therein for drawing air thereinto. Thus, a first wafer W1 to be bonded is attracted to one end surface of the first pressure plate unit 12A in the thickness direction. In addition, a first back plate unit 12B having a cylindrical shape is mounted on the other surface of the first pressure plate unit 12A in the thickness direction. The first back plate unit 12B forms the first block member 12 together with the first pressure plate unit 12A. The diameter of the first back plate unit 12B is substantially the same as that of the first pressure plate unit 12A. The first back plate unit 12B is formed from aluminum nitride (AlN), which is an electrically insulating material. A raised portion 13 is integrally formed on the first back plate unit 12B at substantially the center of the first back plate unit 12B so as to protrude in the thickness direction. Furthermore, a first heater chip 12C is mounted on the surface of the first back plate unit 12B remote from the first pressure plate unit 12A. The first heater chip 12C forms the first block member 12 together with the first pressure plate unit 12A and the first back plate unit 12B. The first heater chip 12C applies heat to the first pressure plate unit 12A. The first heater chip 12C is formed from silicon carbide (SiC). Since the first heater chip 12C is mounted on the first pressure plate unit 12A, which is composed of an electrically conductive material, with the first back plate unit 12B, which is composed of an electrically insulating material, therebetween, the first heater chip 12C is electrically insulated from the first pressure plate unit 12A.

Figure 4:
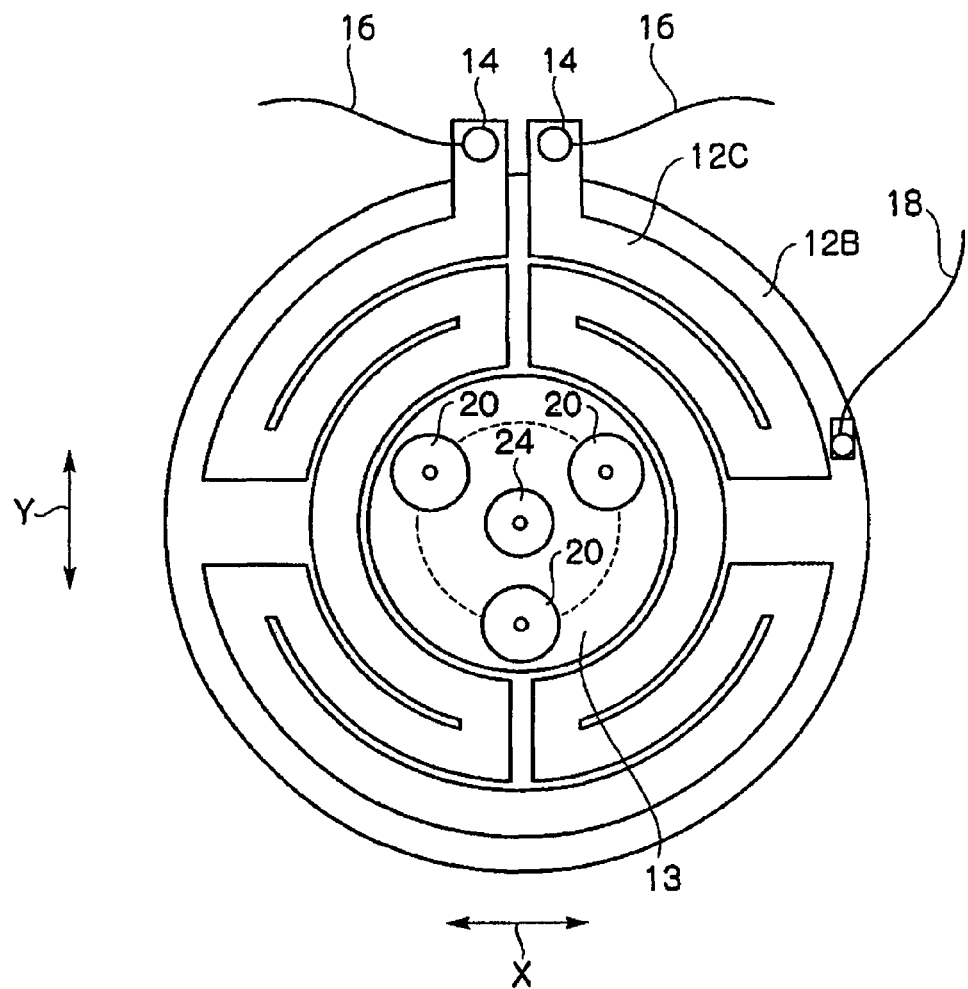
FIG. 4 is a cross-sectional view taken along a line A-A of FIG. 1.

As shown in FIG. 4, the first heater chip 12C has an optimal resistance value. A power feeding line 16 is connected to each of two electrodes 14. A thermal controller (not shown) is connected to the power feeding lines 16 so as to control an electrical current applied to the first heater chip 12C via the power feeding lines 16. By applying a predetermined electrical current to the first heater chip 12C via the power feeding lines 16, the temperature of the first heater chip 12C can be increased or decreased.

In addition, a first thermo couple 18 is connected to a point on the first back plate unit 12B in the vicinity of the first heater chip 12C so as to measure the temperatures of the first pressure plate unit 12A and the first back plate unit 12B. The first thermo couple 18 is further connected to the above-described thermal controller. An electrical current applied to the first heater chip 12C is controlled by the thermal controller on the basis of the temperature value measured by the first thermo couple 18. In this way, the temperature of the first pressure plate unit 12A and the first back plate unit 12B is controlled to an optimum value.

In this example, the linear expansion coefficients of the first pressure plate unit 12A, the first back plate unit 12B, and the first heater chip 12C are the same or substantially the same. In addition, the first pressure plate unit 12A, the first back plate unit 12B, and the first heater chip 12C have relatively high thermal conductivities. Furthermore, the first pressure plate unit 12A, the first back plate unit 12B, and the first heater chip 12C are fastened using a bolt (not shown) formed from molybdenum so as to be connected to each other.

In addition, as shown in FIGS. 1 to 3, a first cooling groove (a first cooling gas flow passage) 15 is formed on an interface between the first pressure plate unit 12A and the first back plate unit 12B. More specifically, a first cooling groove 15 having an opening is formed in the first back plate unit 12B. The other end surface of the tabular first pressure plate unit 12A in the thickness direction is fastened to the first back plate unit 12B using a bolt so that the opening of the first cooling groove 15 is closed. The first cooling groove 15 communicates with the outside. Note that any first cooling groove 15 that can be formed when the first pressure plate unit 12A is fastened to the first back plate unit 12B using a bolt is applicable. For example, the first cooling groove 15 may be formed in the first pressure plate unit 12A or in both the first pressure plate unit 12A and the first back plate unit 12B. N₂ gas serving as cooling gas is supplied to the first cooling groove 15. The N₂ gas flows inside the first cooling groove 15.

In addition, as shown in FIGS. 1 to 4, three first support pillar members (first flexible members) 20 each having the same dimensions and shape are connected to the surface of the raised portion 13 of the first back plate unit 12B. The first support pillar members 20 are formed from silicon nitride (Si₃N₄). The three first support pillar members 20 are circumferentially equiangularly spaced (at angles of 120 degrees) about the center line of the first pressure plate unit 12A and the first back plate unit 12B. One end of each of the first support pillar members 20 is connected to the raised portion 13 of the first back plate unit 12B, while the other end is connected to a first pressure shaft (a first pressure member) 22.

Let d be the diameter of each of the first support pillar members 20. Let l be the length of each of the first support pillar members 20 in the axial direction. Let E be Young's modulus of the first support pillar members 20. Let $\sigma_{max}$ be the maximum bending strength. Let A be the safety factor. Let Δy be the difference between deflections at one end and the other end of each of the first support pillar members 20. Then, the diameter and the length in the axial direction are determined so that the following conditional expression is satisfied: $3EAd\Delta y/l^2 < \sigma_{max}$. Note that the safety factor A is a natural number greater than or equal to 1. For example, it is desirable that the safety factor A is about 8.

In addition, each of the first support pillar members 20 is formed to be hollow. One end of each of the first support pillar members 20 communicates with the first cooling groove 15. Furthermore, the other end of each of the first support pillar members 20 communicates with a first $N_2$ gas supply flow passage (a first cooling gas supply flow passage) 19, described below, formed in the first pressure shaft 22. The $N_2$ gas supplied from the first $N_2$ gas supply flow passage 19 into each of the first support pillar members 20 is then supplied to the first cooling groove 15 so that the first pressure plate unit 12A and the first back plate unit 12B are cooled. After the first pressure plate unit 12A and the first back plate unit 12B are cooled, the $N_2$ gas supplied to the first cooling groove 15 is discharged to the outside.

The other end of each of the first support pillar members 20 is connected to the first pressure shaft (the first pressure member) 22. The first pressure shaft 22 applies pressure to the first block member 12 via the first support pillar members 20.

In addition, the linear expansion coefficient of the first support pillar members 20 is substantially the same as that of the first pressure plate unit 12A and the first back plate unit 12B. The thermal conductivity of the first support pillar members 20 is less than those of the first pressure plate unit 12A and the first back plate unit 12B.

Figure 5:
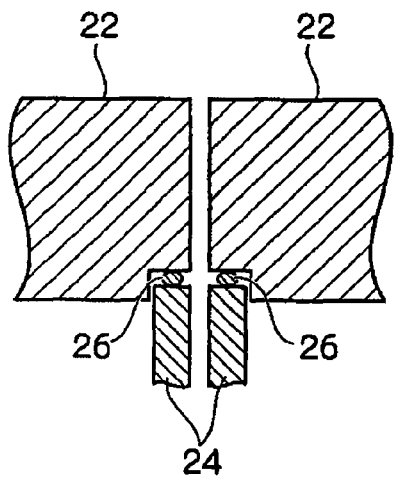
FIG. 5 is a schematic cross-sectional view illustrating a connection structure of a first pressure member and a first hollow duct of a bonding device according to the embodiment.

In addition, as shown in FIGS. 4 and 5, a first hollow member (a first hollow duct) 24 having a length substantially the same as that of the first support pillar members 20 in the axial direction is connected to the surface of the raised portion 13 of the first back plate unit 12B. The first hollow member 24 is connected at the center of the first pressure plate unit 12A and the first back plate unit 12B. One end of the first hollow member 24 is connected to the raised portion 13 of the first back plate unit 12B, while the other end is connected to the first pressure shaft 22 via a first O ring (a first elastic material) 26. That is, as shown in FIG. 5, a gap is formed between the other end of the first hollow member 24 and the first pressure shaft 22. Thus, the first hollow member 24 and the first pressure shaft 22 are not directly connected to each other. The first hollow member 24 and the first pressure shaft 22 are connected to each other with the first O ring 26 therebetween. The first O ring 26 is formed from a rubber, which is an elastic material.

In addition, a first air flow passage 23 is formed in the first pressure shaft 22 and is disposed on the other end of the first hollow member 24. Air flows from the first hollow member 24 into the first air flow passage 23. In this way, the first attraction grooves 17 communicate with the first air flow passage 23 so that the air can be drawn from the first attraction grooves 17.

In addition, as shown in FIG. 1, the bonding device 10 includes the first pressure shaft (the first pressure member) 22. The first pressure shaft 22 includes the first $N_2$ gas supply flow passage (the first cooling gas supply flow passage) 19 formed therein. $N_2$ gas supplied into the first support pillar members 20 flows in the first $N_2$ gas supply flow passage 19. The first pressure shaft 22 further includes the above-described first air flow passage 23 formed therein. Still furthermore, the first pressure shaft 22 includes a first cooling fluid circulation passage 25 that circulates fluid for cooling the first pressure shaft 22 itself.

In addition, an $N_2$ gas supply unit (not shown) for supplying $N_2$ gas to the first $N_2$ gas supply flow passage 19, an air supply unit (not shown) for supplying air (cooling air) to the first cooling fluid circulation passage 25, and a suction pump (not shown) for evacuating air from the first air flow passage 23 are connected to the bonding device 10. Thus, $N_2$ gas can be supplied to the first $N_2$ gas supply flow passage 19, and air can be supplied to the first cooling fluid circulation passage 25. In addition, the first air flow passage 23 can be evacuated to vacuum.

In addition, the first pressure shaft 22 is connected to a Z-axis driving mechanism (not shown). The Z-axis driving mechanism can move the first pressure shaft 22 in a vertical direction (a Z direction indicated by an arrow in FIG. 1). In this way, as the first pressure shaft 22 moves in the vertical direction (the Z direction indicated by an arrow in FIG. 1), the first block member 12 moves in the vertical direction. The Z-axis driving mechanism is electrically connected to a control unit (not shown).

In addition, a load cell (not shown) is provided in order to measure a pressure exerted on the first wafer W1. The Z-axis driving mechanism is controlled by the control unit (not shown) on the basis of a value measured by the load cell. In this way, a predetermined optimum pressure is exerted on the first block member 12 at all times.

As noted above, a first space M1 is formed between the first block member 12 and the first pressure shaft 22. The first space M1 accommodates the first support pillar members 20 and the first hollow member 24.

As shown in FIG. 1, the bonding device 10 includes a second pressure plate unit 28A that has a cylindrical shape and that forms a second block member 28. The second pressure plate unit 28A is formed from silicon carbide (SiC), which is an electrically conductive material. The second pressure plate unit 28A includes a plurality of second attraction grooves 33 formed therein for drawing air thereinto. Thus, a second wafer W2 to be bonded is attracted to one end surface of the second pressure plate unit 28A in the thickness direction. In addition, a second back plate unit 28B having a cylindrical shape is mounted on the other end surface of the second pressure plate unit 28A in the thickness direction. The second back plate unit 28B forms the second block member 28 together with the second pressure plate unit 28A. The diameter of the second back plate unit 28B is substantially the same as that of the second pressure plate unit 28A. The second back plate unit 28B is formed from aluminum nitride (AlN), which is an electrically insulating material. A raised portion 29 is integrally formed on the second back plate unit 28B at substantially the center of the second back plate unit 28B so as to protrude in the thickness direction. Furthermore, a second heater chip 28C is mounted on the end surface of the second back plate unit 28B remote from the second pressure plate unit 28A. The second heater chip 28C forms the second block member 28 together with the second pressure plate unit 28A and the second back plate unit 28B. The second heater chip 28C applies heat to the second pressure plate unit 28A. The second heater chip 28C is formed from silicon carbide (SiC). Since the second heater chip 28C is mounted on the second pressure plate unit 28A, which is composed of an electrically conductive material, with the second back plate unit 28B, which is composed of an electrically insulating material, therebetween, the second heater chip 28C is electrically insulated from the second pressure plate unit 28A.

Figure 6:
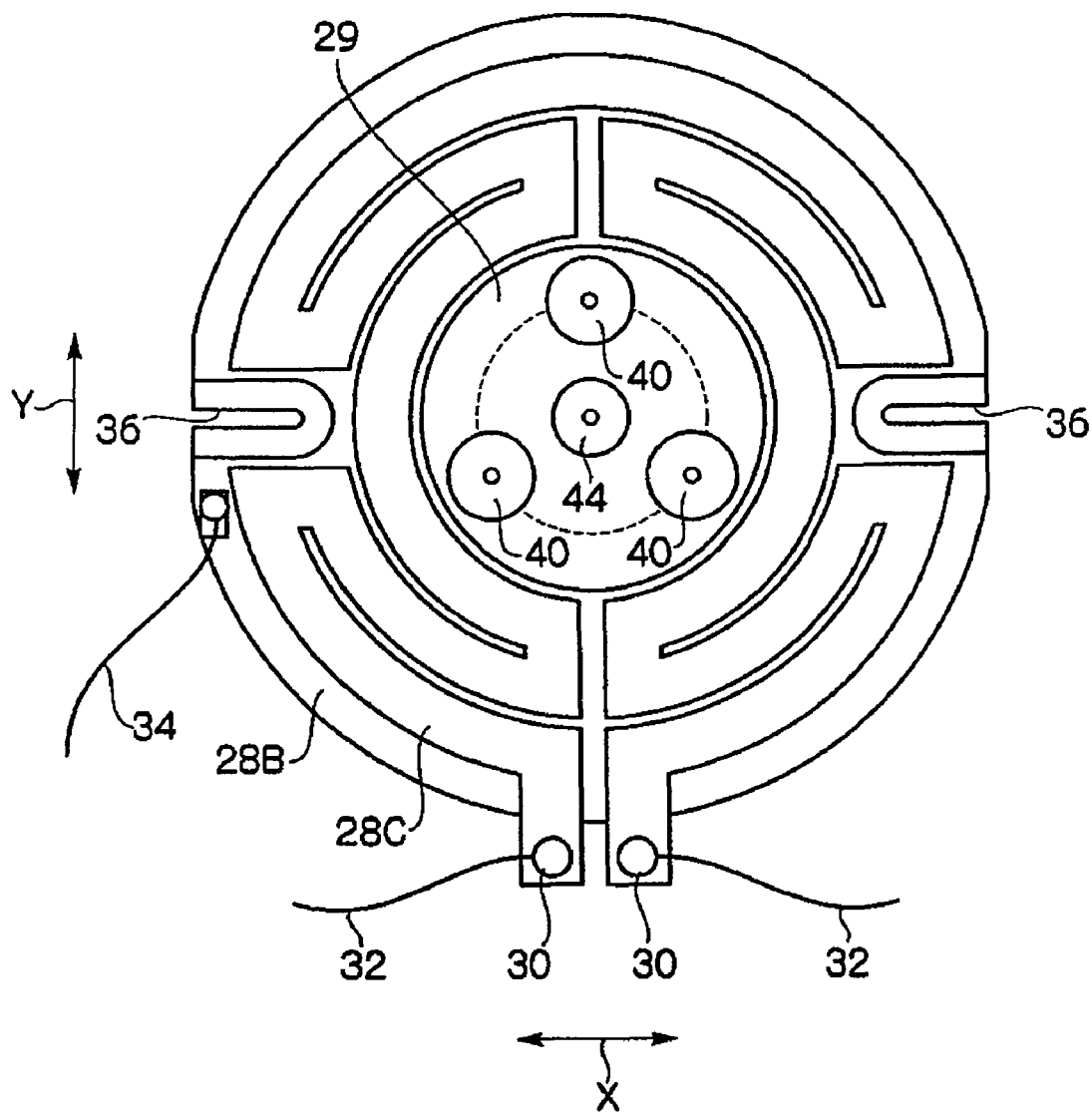
FIG. 6 is a cross-sectional view taken along a line B-B of FIG. 1.

As shown in FIG. 6, the second heater chip 28C has an optimal resistance value. A power feeding line 32 is connected to each of two electrodes 30. A thermal controller (not shown) is connected to the power feeding lines 32 so that an electrical current applied to the second heater chip 28C is controlled by the thermal controller via the power feeding lines 32. By applying a predetermined electrical current to the second heater chip 28C via the power feeding lines 32, the temperature of the second heater chip 28C can be increased or decreased.

In addition, a second thermo couple 34 is connected to a point on the second back plate unit 28B in the vicinity of the second heater chip 28C so as to measure the temperatures of the second pressure plate unit 28A and the second back plate unit 28B. The second thermo couple 34 is further connected to the above-described thermal controller. An electrical current applied to the second heater chip 28C is controlled by the thermal controller on the basis of temperature values measured by the second thermo couple 34. In this way, the temperatures of the second pressure plate unit 28A and the second back plate unit 28B are controlled to desired values.

In this example, the linear expansion coefficients of the second pressure plate unit 28A, the second back plate unit 28B, and the second heater chip 28C are the same or substantially the same. In addition, the second pressure plate unit 28A, the second back plate unit 28B, and the second heater chip 28C have relatively high thermal conductivities. Furthermore, the second pressure plate unit 28A, the second back plate unit 28B, and the second heater chip 28C are fastened using a bolt (not shown) formed from molybdenum so as to be connected to each other.

In addition, as shown in FIG. 1, a second cooling groove (a second cooling gas flow passage) 31 is formed on an interface between the second pressure plate unit 28A and the second back plate unit 28B. More specifically, a second cooling groove 31 having an opening is formed in the second back plate unit 28B. The other end surface of the tabular second pressure plate unit 28A in the thickness direction is fastened to the second back plate unit 28B using a bolt so that the opening of the second cooling groove 31 is closed. The second cooling groove 31 communicates with the outside. Note that any second cooling groove 31 that can be formed when the second pressure plate unit 28A is fastened to the second back plate unit 28B using a bolt is applicable. For example, the second cooling groove 31 may be formed in the second pressure plate unit 28A or in both the second pressure plate unit 28A and the second back plate unit 28B. $N_2$ gas serving as cooling gas is supplied to the second cooling groove 31. The $N_2$ gas flows inside the second cooling groove 31.

Figure 7:
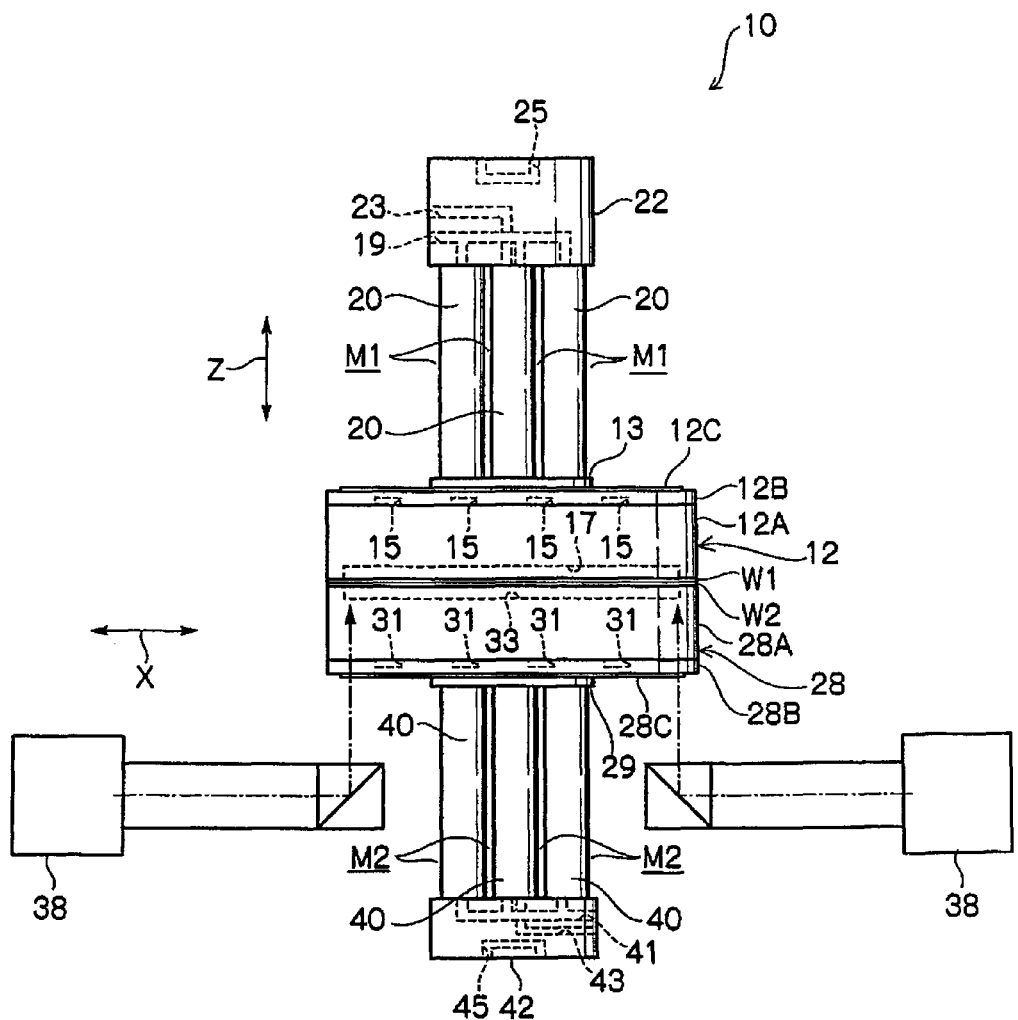
FIG. 7 is a schematic configuration diagram of a bonding device provided with an image capturing member according to the embodiment.

In this example, as shown in FIGS. 6 and 7, two notches (through-openings) 36 are formed in the second pressure plate unit 28A, the second back plate unit 28B, and the second heater chip 28C so as to pass through the second pressure plate unit 28A, the second back plate unit 28B, and the second heater chip 28C in the thickness direction. Two image capturing members 38 are disposed in a second space M2 described below in the vicinity of the notches 36. The image capturing members 38 are connected to the control unit. Image data captured by the image capturing members 38 is output to the control unit. The opening area of each of the notches 36 in the second pressure plate unit 28A, the second back plate unit 28B, and the second heater chip 28C increases towards one side (towards the image capturing members 38) in the thickness direction. Thus, the opening area of each of the notches 36 in the second pressure plate unit 28A, the second back plate unit 28B, and the second heater chip 28C decreases towards the other side (in the direction away from the image capturing members 38) in the thickness direction.

In the case of the second wafer W2 formed from a glass wafer, it is desirable that the image capturing members 38 are CCD cameras. In contrast, in the case of the second wafer W2 formed from a Si wafer, it is desirable that the image capturing members 38 are infrared cameras. When CCD cameras are used for the image capturing members, an alignment mark formed on the second wafer W2 can be clearly recognized by emitting light from the side of the CCD cameras to the second wafer W2.

In addition, as shown in FIG. 6, three second support pillar members (second flexible members) 40 each having the same dimensions and shape are connected to the surface of the raised portion 29 of the second back plate unit 28B. The second support pillar members 40 are formed from silicon nitride ($Si_3N_4$). The three second support pillar members 40 are circumferentially equiangularly spaced (at angles of 120 degrees) about the center line of the second pressure plate unit 28A and the second back plate unit 28B. One end of each of the second support pillar members 40 is connected to the raised portion 29 of the second back plate unit 28B, while the other end is connected to a second pressure shaft (a second pressure member) 42.

Let d be the diameter of each of the second support pillar members 40. Let l be the length of each of the second support pillar members 40 in the axial direction. Let E be Young's modulus of the second support pillar members 40. Let $\sigma_{max}$ be the maximum bending strength. Let A be the safety factor. Let $\Delta y$ be the difference between deflections at one end and the other end of each of the second support pillar members 40. Then, the diameter and the length in the axial direction are determined so that the following conditional expression is satisfied: $3EAd\Delta y/l^2 < \sigma_{max}$. Note that the safety factor A is a natural number greater than or equal to 1. For example, it is desirable that the safety factor A is about 8.

In addition, each of the second support pillar members 40 is formed to be hollow. One end of each of the second support pillar members 40 communicates with the second cooling groove 31. Furthermore, the other end of each of the second support pillar members 40 communicates with a second $N_2$ gas supply flow passage (a second cooling gas supply flow passage) 41, described below, formed in the second pressure shaft 42. The $N_2$ gas supplied from the second $N_2$ gas supply flow passage 41 into each of the second support pillar members 40 is then supplied to the second cooling groove 31 so that the second pressure plate unit 28A and the second back plate unit 28B are cooled. After the second pressure plate unit 28A and the second back plate unit 28B are cooled, the $N_2$ gas supplied to the second cooling groove 31 is discharged to the outside.

In addition, as shown in FIGS. 1 and 7, the other end of each of the second support pillar members 40 is connected to the second pressure shaft (the second pressure member) 42. The second pressure shaft 42 applies pressure to the second block member 28 via the second support pillar members 40.

In addition, the linear expansion coefficient of the second support pillar members 40 is the same as or substantially the same as that of the second pressure plate unit 28A and the second back plate unit 28B. The thermal conductivity of the second support pillar members 40 is less than those of the second pressure plate unit 28A and the second back plate unit 28B.

In addition, as shown in FIG. 6, a second hollow member (a second hollow duct) 44 having a length substantially the same as that of the second support pillar members 40 in the axial direction is connected to the surface of the raised portion 29 of the second back plate unit 28B. The second hollow member 44 is connected at the center of the second pressure plate unit 28A and the second back plate unit 28B. One end of the second hollow member 44 is connected to the raised portion 29 of the second back plate unit 28B, while the other end is connected to the second pressure shaft (the second pressure member) 42 via a second O ring (a second elastic material, not shown). That is, a gap is formed between the other end of the second hollow member 44 and the second pressure shaft 42. Thus, the second hollow member 44 and the second pressure shaft 42 are not directly connected to each other. The second hollow member 44 and the second pressure shaft 42 are connected to each other with the second O ring therebetween. Note that the second O ring is formed from a rubber, which is an elastic material.

In addition, a second air flow passage 43 is formed in the second pressure shaft 42 and is disposed on the other end of the second hollow member 44. The air flows from the second hollow member 44 into the second air flow passage 43. In this way, the second attraction grooves 33 communicate with the second air flow passage 43 so that the air can be drawn from the second attraction grooves 33.

In addition, the bonding device 10 includes the second pressure shaft 42. The second pressure shaft 42 includes the second $N_2$ gas supply flow passage (the second cooling gas supply flow passage) 41 formed therein. $N_2$ gas supplied into the second support pillar members 40 flows through the second $N_2$ gas supply flow passage 41. The second pressure shaft 42 further includes the above-described second air flow passage 43 formed therein. Still furthermore, the second pressure shaft 42 includes a second cooling fluid circulation passage 45 that circulates air for cooling the second pressure shaft 42 itself.

In addition, an $N_2$ gas supply unit (not shown) for supplying $N_2$ gas to the second $N_2$ gas supply flow passage 41, an air supply unit (not shown) for supplying air (cooling air) to the second cooling fluid circulation passage 45, and a suction pump (not shown) for evacuating air from the second air flow passage 43 are connected to the bonding device 10. Thus, $N_2$ gas can be supplied to the second $N_2$ gas supply flow passage 41, and air can be supplied to the second cooling fluid circulation passage 45. In addition, the second air flow passage 43 can be evacuated to vacuum.

In addition, the bonding device 10 includes an XY-axis driving mechanism (not shown) that moves the second block member 28, the second support pillar members 40, the second hollow member 44, and the second pressure shaft 42 in the X direction indicated by an arrow in FIG. 1 and the Y direction indicated by an arrow in FIG. 6. The XY-axis driving mechanism is connected to the control unit. The control unit controls the XY-axis driving mechanism so that the second block member 28, the second support pillar members 40, the second hollow member 44, and the second pressure shaft 42 can be moved in the X direction indicated by the arrow in FIG. 1 and the Y direction indicated by the arrow in FIG. 6. Furthermore, the bonding device 10 includes a rotation driving mechanism (not shown) that rotates the second block member 28, the second support pillar members 40, the second hollow member 44, and the second pressure shaft 42 in a predetermined direction. The rotation driving mechanism is connected to the control unit. The control unit controls the rotation driving mechanism so that the second block member 28, the second support pillar members 40, the second hollow member 44, and the second pressure shaft 42 can be rotationally moved in a predetermined direction.

As noted above, the second space M2 is formed between the second block member 28 and the second pressure shaft 42. The second space M2 accommodates the second support pillar members 40 and the second hollow member 44.

The operation of the bonding device 10 according to the present embodiment is described next.

As shown in FIG. 1, the first wafer W1 is attracted to the first pressure plate unit 12A that forms the first block member 12. The second wafer W2 is attracted to the second pressure plate unit 28A that forms the second block member 28. The attractive forces exerted on the first wafer W1 and the second wafer W2 are generated by the suction pump that forces air to flow from the first attraction grooves 17 and the second attraction grooves 33 to the first air flow passage 23 and the second air flow passage 43 through the first hollow member 24 and the second hollow member 44, respectively. In this way, the first wafer W1 and the second wafer W2 can be reliably attracted. In addition, a positional shift between the first wafer W1 and the first pressure plate unit 12A and a positional shift between the second wafer W2 and the second pressure plate unit 28A can be prevented. A solder pattern is formed on each of the first wafer W1 and the second wafer W2 in advance. The solder pattern serves as a bonding material. Accordingly, when the first wafer W1 and the second wafer W2 are pressed against each other and are heated, the solder materials melt into ally, and therefore, the first wafer W1 is bonded to the second wafer W2.

Subsequently, the first pressure shaft 22 is driven under the control of the Z-axis driving mechanism so that the first block member 12 having the first wafer W1 attracted thereto is moved by the first pressure shaft 22 towards the second block member 28. Thus, the first wafer W1 can be in close proximity to the second wafer W2.

Thereafter, as shown in FIG. 7, when the first wafer W1 and the second wafer W2 reach a point at which the first wafer W1 is in close proximity to the second wafer W2, the image capturing members 38 capture the images of the alignment marks formed on the first wafer W1 and the second wafer W2. Subsequently, the control unit controls the XY-axis driving mechanism and the rotation driving mechanism on the basis of the images captured by the image capturing members 38. Thus, the second block member 28 is moved by the XY-axis driving mechanism and the rotation driving mechanism so that the second wafer W2 is positioned at a predetermined point relative to the first wafer W1. In this way, positioning of the second wafer W2 with respect to the first wafer W1 can be achieved. Therefore, the accuracy with which the first wafer W1 is bonded to the second wafer W2 can be increased.

Subsequently, after positioning of the second wafer W2 with respect to the first wafer W1 is completed, the first pressure shaft 22 applies a predetermined pressure to the first block member 12 via the first support pillar members 20. The predetermined pressure applied to the first pressure shaft 22 is controlled in the above-described manner. In this way, the first wafer W1 is in contact with the second wafer W2 with an appropriate pressure.

Thereafter, as shown in FIG. 4, an electrical current is supplied from the power feeding lines 16 to the first heater chip 12C so that the first block member 12 is heated. At that time, the electric current supplied to the first heater chip 12C is controlled by the thermal controller on the basis of a temperature value measured by the first thermo couple 18. Accordingly, the temperatures of the first pressure plate unit 12A and the first back plate unit 12B can be controlled to desired values. Similarly, as shown in FIG. 6, an electric current is supplied from the power feeding lines 32 to the second heater chip 28C so that the second block member 28 is heated. At that time, the electric current supplied to the second heater chip 28C is controlled by the thermal controller on the basis of a temperature value measured by the second thermo couple 34. Accordingly, the temperatures of the second pressure plate unit 28A and the second back plate unit 28B can be controlled to desired values. In this way, the first wafer W1 and the second wafer W2 can be heated so as to have predetermined temperatures.

When the first block member 12 and the second block member 28 are heated, the first block member 12 and the second block member 28 thermally expand. However, the first space M1 is formed between the first block member 12 and the first pressure shaft 22, and the second space M2 is formed between the second block member 28 and the second pressure shaft 42. No heat insulating material is used therebetween. Accordingly, transfer of almost all the heat from the first block member 12 and the second block member 28 to the first pressure shaft 22 and the second pressure shaft 42 is blocked by the first space M1 and the second space M2, respectively. Consequently, the temperatures inside the first block member 12 and the second block member 28 can be made substantially uniform. In addition, when the first wafer W1 is in contact with the second wafer W2, the temperatures of the first block member 12, the second block member 28, the first wafer W1, and the second wafer W2 can be made uniform as a whole. As a result, the flatness of the surface of the first block member 12 for grasping the first wafer W1 and the flatness of the surface of the second block member 28 for grasping the second wafer W2 can be maintained.

Even when the first block member 12 and the second block member 28 are heated, the first space M1 and the second space M2 reduce the amount of heat transferred from the first block member 12 and the second block member 28 to the first pressure shaft 22 and the second pressure shaft 42, respectively. Therefore, practically, only the first block member 12, the second block member 28, the first wafer W1, and the second wafer W2 are heated by the first heater chip 12C and the second heater chip 28C. Thus, the heat capacity of these heated components can be reduced, and therefore, a time required for heating and cooling the first wafer W1 and the second wafer W2 can be reduced. As a result, the operation availability of the bonding device 10 can be increased.

In addition, deflection of each of the first support pillar members 20 and the second support pillar members 40 can relieve the stress caused by a difference between thermal expansion of the first block member 12 and the second block member 28 and thermal expansion of the first pressure shaft 22 and the second pressure shaft 42. That is, since the first support pillar members 20 and the second support pillar members 40 have a rod shape, the bending rigidity thereof is relatively small. Accordingly, the first support pillar members 20 and the second support pillar members 40 can bend without causing curvature deformation of the first block member 12 and the second block member 28. Thus, the difference between the thermal expansions can be relieved. As a result, the flatness of the surface of the first block member 12 for grasping the first wafer W1 and the flatness of the surface of the second block member 28 for grasping the second wafer W2 can be maintained.

At that time, the plurality of first support pillar members 20 are disposed so as to be circumferentially equiangularly spaced about the center line of the first block member 12. Accordingly, a shift of the center of the first block member 12 from the center of the first pressure shaft 22 due to deflection of the first support pillar members 20 can be prevented. Similarly, the plurality of second support pillar members 40 are disposed so as to be circumferentially equiangularly spaced about the center line of the second block member 28. Accordingly, a shift of the center of the second block member 28 from the center of the second pressure shaft 42 due to deflection of the second support pillar members 40 can be prevented. Consequently, the first wafer W1 is not shifted from the second wafer W2 due to application of heat. In addition, the occurrence of stress in the first wafer W1 and the second wafer W2 can be prevented.

In addition, since the first support pillar members 20 are disposed so as to be circumferentially equiangularly spaced about the center line of the first block member 12, the pressure is transferred from the first pressure shaft 22 to the first block member 12 in a well balanced manner. Similarly, since the second support pillar members 40 are disposed so as to be circumferentially equiangularly spaced about the center line of the second block member 28, the pressure is transferred from the second pressure shaft 42 to the second block member 28 in a well balanced manner. Consequently, the pressures applied to the first wafer W1 and the second wafer W2 are uniform throughout the surfaces.

In particular, since the first block member 12 includes the first pressure plate unit 12A, the first back plate unit 12B, and the first heater chip 12C, and the linear expansion coefficients of the first pressure plate unit 12A, the first back plate unit 12B, and the first heater chip 12C are the same or substantially the same, the differences among the amounts of thermal expansions of the first pressure plate unit 12A, the first back plate unit 12B, and the first heater chip 12C can be reduced. Accordingly, the occurrence of curvature deformation of the first block member 12 can be prevented, and therefore, the flatness of the first block member 12 can be maintained. This advantage can also be applied to the second block member 28. The flatness of the second block member 28 can be maintained.

Subsequently, after the first wafer W1 is bonded to the second wafer W2 with an appropriate pressure, the supply of the electrical current to the first heater chip 12C is stopped, and $N_2$ gas is supplied from the first support pillar members 20 to the first cooling groove 15 of the first block member 12. The $N_2$ gas is supplied from the $N_2$ gas supply unit to the first $N_2$ gas supply flow passage 19 of the first pressure shaft 22, and subsequently, is supplied from each of the first support pillar members 20 to the first cooling groove 15 of the first block member 12. In this way, the first block member 12 can be rapidly cooled, and therefore, the first wafer W1 can be rapidly cooled. Similarly, the supply of the electrical current to the second heater chip 28C is stopped, and $N_2$ gas is supplied from each of the second support pillar members 40 to the second cooling groove 31 of the second block member 28. This $N_2$ gas is supplied from the $N_2$ gas supply unit to the second $N_2$ gas supply flow passage 41 of the second pressure shaft 42, and subsequently, is supplied from each of the second support pillar members 40 to the second cooling groove 31 of the second block member 28. In this way, the second block member 28 can be rapidly cooled, and therefore, the second wafer W2 can be rapidly cooled.

As in the case where the first block member 12 and the second block member 28 are heated, even when the first block member 12 and the second block member 28 are cooled, each of the first support pillar members 20 and the second support pillar members 40 bends. Thus, the flatness of the first block member 12 and the second block member 28 can be maintained.

In particular, since the first support pillar members 20 and the second support pillar members 40 further have a cooling gas supply function that allows $N_2$ gas to flow therethrough and allows the $N_2$ gas to be supplied to the first cooling groove 15 and the second cooling groove 31, the first support pillar members 20 and the second support pillar members 40 can be used as means for supplying $N_2$ gas to the first cooling groove 15 and the second cooling groove 31.

In addition, as shown in FIG. 5, the first hollow member 24 is connected to the first pressure shaft 22 with the first O ring 26 therebetween. Accordingly, even when the difference between the amounts of heat deformation between each of the first support pillar members 20 and the first hollow member 24 occurs when, for example, they are cooled, elastic deformation of the first O ring 26 can relieve the stress transferred from the first pressure shaft 22 to the first block member 12 via the first hollow member 24. Thus, transfer of the stress from the first pressure shaft 22 to the first block member 12 via the first hollow member 24 can be prevented, and therefore, the flatness of the first block member 12 can be maintained. This advantage is also applied to the second hollow member 44, and therefore, the flatness of the second block member 28 can be maintained.

After the temperatures of the first wafer W1 and the second wafer W2 are cooled to a low temperature, the supply of the $N_2$ gas and the operation of the suction pump are stopped. Thus, the bonded first wafer W1 and the second wafer W2 can be taken out from the bonding device 10.

As noted above, according to the bonding device 10 of the present embodiment, the bonding device 10 is not affected by heat, and therefore, the flatness of the first block member 12 and the second block member 28 can be maintained. Consequently, the first wafer W1 can be bonded to the second wafer W2 while the flatness of the first wafer W1 and the second wafer W2 can be maintained. As a result, the bonding accuracy can be increased and stabilized.

In particular, as described above, the first pressure shaft 22 includes the first $N_2$ gas supply flow passage 19 that allows $N_2$ gas supplied to the first support pillar members 20 to flow therethrough and the first air flow passage 23 that allows air drawn from the first hollow member 24 to flow therethrough. Accordingly, the first pressure shaft 22 can be used as part of cooling gas supply means and part of air discharging means. The same can apply to the second pressure shaft 42. In this way, the need for direct connection of pipes to the first block member 12 and the second block member 28 that have high temperature is eliminated. Thus, cooling and vacuum attraction can be easily achieved.

In addition, the first pressure shaft 22 includes the first cooling fluid circulation passage 25 formed therein. The first cooling fluid circulation passage 25 allows air for cooling the first pressure shaft 22 to circulate therethrough. Therefore, by circulating cooling air in the first cooling fluid circulation passage 25, the first pressure shaft 22 can be cooled at all times. In this way, the first pressure shaft 22 can be maintained at an even lower temperature even when the bonding device 10 is operating. Accordingly, when a tube used for supplying cooling gas or cooling air to the first pressure shaft 22 or a tube used for discharging air from the first pressure shaft 22 is connected, the tube can be easily connected regardless of the material of the tube. This is the same for the second pressure shaft 42.

While the foregoing embodiment has been described with reference to the method in which the first wafer W1 and the second wafer W2 are heated and are bonded by thermocompression bonding, the bonding method is not limited thereto. For example, the first wafer W1 and the second wafer W2 may be bonded using anodic bonding. That is, the first pressure plate unit 12A and the second pressure plate unit 28A may be formed from an electrically conductive material. The first back plate unit 12B and the second back plate unit 28B may be formed from an electrically insulating material. Thus, the first pressure plate unit 12A is electrically insulated from the first heater chip 12C. In addition, the second pressure plate unit 28A is electrically insulated from the second heater chip 28C. In this way, by applying a predetermined voltage to the first pressure plate unit 12A and the second pressure plate unit 28A when the first pressure plate unit 12A and the second pressure plate unit 28A are heated, a Si wafer can be bonded to a glass wafer using anodic bonding. As a result, the variety of bonding methods can be increased.

Although particular embodiments have been described, many other variations and modifications and other uses will become apparent to those skilled in the art. Therefore, the present invention is not limited by the specific disclosure herein.

What is claimed is:

1. A bonding device comprising:
a first block member for grasping a first electronic component using one end surface thereof;
a first pressure member disposed on the first block member with a first space therebetween, the first pressure member applying a pressure to the first block member in a predetermined direction;
a plurality of rod-shaped first flexible members disposed in the first space, the first flexible members connected to the other end surface of the first block member so as to be circumferentially equiangularly spaced about the center line of the first block member, the first flexible members transferring pressure applied by the first pressure member to the first block member;
a second block member disposed so as to be capable of facing the first block member, the second block member grasping a second electronic component to be bonded to the first electronic component using one end surface thereof;
a second pressure member disposed on the second block member with a second space therebetween, the second pressure member applying a pressure to the second block member in a direction in which the second block member urges the first block member;
a plurality of rod-shaped second flexible members disposed in the second space, the second flexible members connected to the other end surface of the second block member so as to be circumferentially equiangularly spaced about the center line of the second block member, the second flexible members transferring a pressure applied by the second pressure member to the second block member; and
a heating member for heating the first block member and the second block member.

2. The bonding device according to claim 1, wherein a through-opening is formed in at least one of the first block member and the second block member so as to pass through said at least one of the first block member and the second block member in a thickness direction.

3. The bonding device according to claim 2, wherein an opening area of the through-opening formed in said at least one of the first block member and the second block member on one side in the thickness direction is larger than an opening area on the other side in the thickness direction.

4. The bonding device according to claim 1, wherein the heating member is a heater chip, and
wherein the first block member comprises a first pressure plate unit for grasping the first electronic component, a first back plate unit connected to the first pressure plate unit and having a linear expansion coefficient that is substantially the same as a linear expansion coefficient of the first pressure plate unit, and the heater chip connected to the first back plate unit, the heater chip heats the first pressure plate unit and has a linear expansion coefficient that is substantially the same as the linear expansion coefficient of the first pressure plate unit, and
wherein the second block member comprises a second pressure plate unit for grasping the second electronic component, a second back plate unit connected to the second pressure plate unit and having a linear expansion coefficient that is substantially the same as a linear expansion coefficient of the second pressure plate unit, and the heater chip connected to the second back plate unit, the heater chip heats the second pressure plate unit and has a linear expansion coefficient that is substantially the same as the linear expansion coefficient of the second pressure plate unit.

5. The bonding device according to claim 4, wherein the first pressure plate unit and the second pressure plate unit are formed from an electrically conductive material, and the first back plate unit and the second back plate unit are formed from an electrically insulating material.

6. The bonding device according to claim 5, wherein a first cooling gas flow passage that allows cooling gas to flow therethrough is formed between the first pressure plate unit and the first back plate unit, and a second cooling gas flow passage that allows cooling gas to flow therethrough is formed between the second pressure plate unit and the second back plate unit.

7. The bonding device according to claim 4, wherein a first cooling gas flow passage that allows cooling gas to flow therethrough is formed between the first pressure plate unit and the first back plate unit, and a second cooling gas flow passage that allows cooling gas to flow therethrough is formed between the second pressure plate unit and the second back plate unit.

8. The bonding device according to claim 6, wherein the first flexible members further have a cooling gas supply that allows the cooling gas to flow therethrough and allows the cooling gas to be supplied to the first cooling gas flow passage, and wherein the second flexible members further have a cooling gas supply that allows the cooling gas to flow therethrough and allows the cooling gas to be supplied to the second cooling gas flow passage.

9. The bonding device according to claim 4, further comprising:
first attracting means for attracting the first electronic component to the first pressure plate unit; and
second attracting means for attracting the second electronic component to the second pressure plate unit.

10. The bonding device according to claim 5, further comprising:
first attracting means for attracting the first electronic component to the first pressure plate unit; and
second attracting means for attracting the second electronic component to the second pressure plate unit.

11. The bonding device according to claim 9, wherein the first attracting means comprises a plurality of first attraction grooves formed in the first pressure plate unit and a first hollow duct that allows air drawn from the first attraction grooves to flow therethrough, and wherein the second attracting means comprises a plurality of second attraction grooves formed in the second pressure plate unit and a second hollow duct that allows air drawn from the second attraction grooves to flow therethrough.

12. The bonding device according to claim 11, wherein the first hollow duct is connected to the first pressure member with a first elastic member therebetween, and the second hollow duct is connected to the second pressure member with a second elastic member therebetween.

13. The bonding device according to claim 12, wherein a first cooling gas supply flow passage that allows the cooling gas supplied to the first flexible members to flow therethrough and a first air flow passage that allows air drawn from the first hollow duct to flow therethrough are formed in the first pressure member, and wherein a second cooling gas supply flow passage that allows the cooling gas supplied to the second flexible members to flow therethrough and a second air flow passage that allows air drawn from the second hollow duct to flow therethrough are formed in the second pressure member.

14. The bonding device according to claim 11, wherein a first cooling gas supply flow passage that allows the cooling gas supplied to the first flexible members to flow therethrough and a first air flow passage that allows air drawn from the first hollow duct to flow therethrough are formed in the first pressure member, and wherein a second cooling gas supply flow passage that allows the cooling gas supplied to the second flexible members to flow therethrough and a second air flow passage that allows air drawn from the second hollow duct to flow therethrough are formed in the second pressure member.

15. The bonding device according to claim 1, wherein a first cooling fluid circulation passage for circulating cooling fluid that cools the first pressure member is formed in the first pressure member, and wherein a second cooling fluid circulation passage for circulating cooling fluid that cools the second pressure member is formed in the second pressure member.

* * * * *